(12) United States Patent
Chen

(10) Patent No.: US 8,906,495 B2
(45) Date of Patent: Dec. 9, 2014

(54) POLYMER-CARBON NANOTUBE COMPOSITES

(75) Inventor: George Zheng Chen, Nottingham (GB)

(73) Assignee: The University of Nottingham (GB)

( * ) Notice: Subject to any disclaimer, the term of this patent is extended or adjusted under 35 U.S.C. 154(b) by 808 days.

(21) Appl. No.: 12/440,704

(22) PCT Filed: Sep. 13, 2007

(86) PCT No.: PCT/GB2007/003472
§ 371 (c)(1),
(2), (4) Date: Dec. 17, 2009

(87) PCT Pub. No.: WO2008/032071
PCT Pub. Date: Mar. 20, 2008

(65) Prior Publication Data
US 2010/0092775 A1   Apr. 15, 2010

(30) Foreign Application Priority Data

Sep. 13, 2006 (GB) .................................. 0618033.5

(51) Int. Cl.
*B32B 3/26* (2006.01)
*B05D 7/00* (2006.01)
(Continued)

(52) U.S. Cl.
CPC .............. *C08G 61/126* (2013.01); *B82Y 40/00* (2013.01); *B82Y 10/00* (2013.01); *B82Y 30/00* (2013.01); *C08K 3/04* (2013.01); *C08K 7/24* (2013.01); *H01B 1/127* (2013.01); *H01B 1/24* (2013.01); *H01G 11/36* (2013.01); *H01L 51/0006* (2013.01); *H01L 51/0037* (2013.01); *H01L 51/0048* (2013.01); *H01L 51/4253* (2013.01); *H01M 4/366* (2013.01); *H01M 4/8657* (2013.01); *H01M 8/0245* (2013.01); *Y02E 60/13* (2013.01); *H01G 11/24* (2013.01); *H01G 11/48* (2013.01); *Y10S 977/742* (2013.01); *Y10S 977/745* (2013.01); *Y10S 977/746* (2013.01); *Y10S 977/748* (2013.01); *Y10S 977/752* (2013.01)
USPC ................. 428/304.4; 428/306.6; 428/308.4; 428/364; 428/367; 428/368; 977/742; 977/745; 977/746; 977/748; 977/752; 427/212; 427/222

(58) Field of Classification Search
CPC ........ B82Y 30/00; B82Y 40/00; H01G 11/36; H01G 11/32
USPC ................. 977/742, 752, 753, 745, 746, 748; 428/304.4, 306.6, 308.4, 311.11, 428/311.51, 364, 367, 368; 429/122, 209, 429/218.1, 231.8; 427/212, 222
See application file for complete search history.

(56) References Cited

U.S. PATENT DOCUMENTS

2003/0077515 A1   4/2003 Chen et al.
2003/0143453 A1*  7/2003 Ren et al. ........................ 429/40
(Continued)

OTHER PUBLICATIONS

Barraza et al., SWNT-Filled Thermoplastic and Elastomeric Composites Prepared by Miniemulsion Polymerization, Nanoletters, vol. 2, No. 8, Aug. 2002, p. 797.*

(Continued)

*Primary Examiner* — Matthew Matzek
(74) *Attorney, Agent, or Firm* — Foley & Lardner LLP

(57) ABSTRACT

This invention relates to a composite comprising carbon nanotubes coated with a polymer, wherein the polymer comprises at least one hydrophobic monomer unit. This invention also relates to a process for the production of a composite comprising a polymer and carbon nanotubes.

17 Claims, 4 Drawing Sheets

(51) Int. Cl.

| | |
|---|---|
| *C08G 61/12* | (2006.01) |
| *B82Y 10/00* | (2011.01) |
| *B82Y 30/00* | (2011.01) |
| *C08K 3/04* | (2006.01) |
| *C08K 7/24* | (2006.01) |
| *H01B 1/12* | (2006.01) |
| *H01B 1/24* | (2006.01) |
| *H01G 11/36* | (2013.01) |
| *H01M 4/36* | (2006.01) |
| *H01G 11/24* | (2013.01) |
| *H01G 11/48* | (2013.01) |
| *B82Y 40/00* | (2011.01) |
| *H01L 51/00* | (2006.01) |
| *H01L 51/42* | (2006.01) |
| *H01M 4/86* | (2006.01) |
| *H01M 8/02* | (2006.01) |

(56) References Cited

U.S. PATENT DOCUMENTS

| | | |
|---|---|---|
| 2003/0180526 A1 | 9/2003 | Winey et al. |
| 2005/0209392 A1* | 9/2005 | Luo et al. ............... 524/496 |
| 2006/0062983 A1 | 3/2006 | Irvin, Jr. et al. |

OTHER PUBLICATIONS

Lota et al., "Capacitance properties of poly(3,4-ethylenedioxythiophene)/carbon nanotubes composites", *Journal of Physics and Chemistry of Solids*, (2004), pp. 295-301, vol. 65, Elsevier Ltd.

Frackowiak et al., "Supercapacitors based on conducting polymers/nanotubes composites", *Journal of Power Sources*, (2006), pp. 413-418, vol. 153, Elsevier B.V.

Peng et al., "Carbon nanotube stabilized emulsions for electrochemical synthesis of porous nanocomposite coatings of poly [3,4-ethylene-dioxythiophene]", *Chem. Commun.*, (2006) pp. 4629-4631, The Royal Society of Chemistry 2006.

Viswanathan et al., "Electrochemical Immunosensor for Cholera Toxin Using Liposomes and Poly(3,4-ethylenedioxythiophene)-Coated Carbon Nanotubes", *Anal. Chem.*, (2006), pp. 1115-1121, American Chemical Society.

Kulesza et al. "Fabrication of network films of conducting polymer-linked polyoxometallate-stabilized carbon nanostructures", *Electrochimica Acta*, (2006), pp. 2373-2379, Elsevier Ltd.

Barraza et al., "SWNT-Filled Thermoplastic and Elastomeric Composites Prepared by Miniemulsion Polymrization" *Nano Letters*, (2002), pp. 797-802, American Chemical Society.

Ham et al., "Singlewall Carbon nanotubes Covered with Polystyrene Nanoparticles by In-Situ Miniemulsion Polymerization", *Journal of Polymer Science: Part A: Polymer Chemistry*, (2005), pp. 573-583, Wiley Periodicals, Inc.

Haggenmueller et al., Interfacial in situ polymerization of single wall carbon nanotube/nylon 6,6 nanocomposites, *Polymer*, Mar. 22, 2006, vol. 47, No. 7, Elsevier Science Publishers GB.

PCT Written Opinion of the International Searching Authority, PCT Application No. PCT/GB2007/003472, dated Mar. 13, 2009, 10 pages.

Communication pursuant to Article 94(3) EPC, EP Application No. 07 804 264.5, dated Apr. 2012, 7 pages.

First Office Action cited for Japanese Patent Application No. 2009-52787 and accompanying English translation, mailed Nov. 13, 2012, (4 pages).

Lota, K. et al., "Capacitance properties of poly (3,4-ethylenedioxythiophene/carbon nanotubes composites," Journal of Physics and Chemistry of Solids 65 (2004) 295-301.

\* cited by examiner

POLYMER-CARBON NANOTUBE COMPOSITES

This invention relates to composites comprising a polymer and carbon nanotubes (CNTs), and to processes for the production of polymer-CNT composites.

Composites comprising a polymer and CNTs are known. George Chen et al (Adv. Mater., 2000, 12, 522) have disclosed a method in which polypyrrole-CNT and polyaniline-CNT composites have been formed by electrochemical co-deposition of negatively charged CNTs and polypyrrole or polyaniline in aqueous media. This process utilises the solubility of pyrrole and aniline, the respective monomer units, in polar solvents, as well as the ease with which the charged CNTs can be dispersed in polar solvents. However, it has not been possible to use this technique to produce polymer-CNT composites comprising polymers in which the monomer units are poorly soluble or insoluble in polar solvents, but are soluble in non-polar solvents (i.e. hydrophobic monomers). The reason for this is that replacing the aqueous reaction medium with a non-polar solvent results in a reaction medium in which the charged CNTs cannot be dispersed.

An alternative approach to the production of polymer-CNT composites in which the monomer units are hydrophobic has been to physically mix the polymer powder and the CNTs, for example by various low and high shear mixing techniques or by grinding. However, a disadvantage of this approach is that the CNTs cannot be well dispersed within the polymer.

A way of ameliorating these problems has been sought.

According to the present invention there is provided a composite comprising carbon nanotubes coated with a polymer, wherein the polymer comprises at least one hydrophobic monomer unit.

An advantage of the polymer-CNT composites of the present invention is that they provide improved conduction and capacitance when compared to the polymer alone and to known polymer-CNT composites in which the polymer comprises at least one hydrophobic monomer unit. This is thought to be due to the coating of the CNTs with the polymer resulting in a composite within which the CNTs are more uniformly dispersed. This creates more interfaces between the polymer and the CNTs. The inclusion of carbon nanotubes in the polymer in this way is also thought to increase the physical strength of the composite.

It is preferred that the carbon nanotubes have a polymer coating that can vary in thickness along the length of each carbon nanotube but is at least 1 nm thick. More preferably, the thickness of the polymer coating can vary along the length of each carbon nanotube but is between 1 nm and 500 nm thick. Even more preferably, the thickness of the polymer coating can vary along the length of each carbon nanotube but is between 1 nm and 200 nm thick. Most preferably, the thickness of the polymer coating can vary along the length of each carbon nanotube but is between 10 nm and 100 nm thick.

The coated CNTs are generally around 10 nm to around 1000 nm in diameter, preferably around 30 nm to around 200 nm in diameter, more preferably around 50 nm to around 100 nm in diameter. The coated CNTs are generally less than or equal to 100 µm in length, preferably around 1 to 10 µm in length. CNTs longer than 100 µm tend to entangle with each other, whereas CNTs less than 100 nm in length tend to have too low a conductivity to provide a sufficient improvement in the conductivity of the polymer.

It is preferred that the composite comprises nanofibrils, i.e. nano-scale fibres comprising a single CNT coated with the polymer. In the composite, the nanofibrils generally form an interconnected network which, when viewed by scanning electron microscope, has a structure similar to a mass of cooked spaghetti.

Preferably the composite has pores. The composites of some embodiments of the present invention generally have two types of pores that are identified by their different sizes. It is preferred that the composite comprises pores having a pore size of ≤1 µm, more preferably 10 nm to 100 nm. These pores are normally formed by the gaps or interstices between the nanofibrils.

It is further preferred that the composite comprises pores having a pore size of ≥1 µm, more preferably ≥10 µm and most preferably ≥100 µm. These pores, which can appear as craters on the surface of the composite, are formed when the CNTs are coated with the polymer electrochemically. The formation of these pores or craters is discussed in more detail below.

The porosity of the composite is particularly important when the composites are used in electrochemical sensors. In such applications, a more porous composite means that any reactant used can more easily interact with the polymer-CNT composite.

Preferably the carbon nanotubes are multi-walled.

Preferably the polymer is a conducting polymer. Alternatively, it is preferred that the polymer is a non-conducting polymer. A non-conducting polymer is generally one through which a current does not pass when a voltage is applied to it.

It is preferred that the polymer is poly[3,4-ethylene-dioxythiophene] (PEDOT).

The composites of the present invention can be used in applications such as batteries, supercapacitors, electrochemical reactors, photovoltaic cells, sensors, chromic displays or solar cells.

According to the present invention there is also provided a process for the production of a composite comprising a polymer and carbon nanotubes, the process comprising the steps of:
(a) dissolving a monomer in a non-polar solvent to form a solution;
(b) dispersing carbon nanotubes in a polar solvent to form a suspension;
(c) forming an emulsion of the solution and the suspension;
(d) polymerising the monomer, and
(e) coating the carbon nanotubes with the polymer.

Preferably the polymerising and coating steps are performed electrochemically. Alternatively, it is preferred that the polymerising and coating steps are performed chemically.

It is preferred that the carbon nanotubes are multiwalled.

Preferably the carbon nanotubes are at least partially oxidised prior to step (b). More preferably, the at least partial oxidation is by acid treatment.

It is preferred that the monomer is 3,4-ethylene-dioxythiophene (EDOT).

According to the present invention there is also provided a composite obtainable according to the process of the invention.

CNTs have both hydrophobic and hydrophilic surface functionalities, which can be enhanced by partial oxidation e.g. by acid treatment. The hydrophobic functionality is due to the graphene layer of the CNT, and the hydrophilic layer is due to the hydroxyl and carboxylic groups formed on the graphene layer. This dual functionality, known as amphiphobicity, means that in the present invention the CNTs are thought to stabilise at interfaces between polar and non-polar solvents.

In some embodiments of the present invention, a hydrophobic monomer is dissolved in the non-polar solvent, preferably an organic solvent, and the CNTs are dispersed in the polar solvent, preferably water. An emulsion of the non-polar solvent and the polar solvent is then formed in which droplets of one solvent (or phase) are dispersed in the other. The emulsion can be formed by sonication or by stirring using a mechanical or magnetic stirrer.

The small size of the CNTs relative to the size of the droplets of one of the polar and non-polar solvents when dispersed in the other solvent allows the CNTs to function as an interfacial barrier hindering droplet coalescence. Thus, the CNTs allow the formation of metastable droplets of one phase dispersed in the other that are stable enough for the reaction that forms the composite to take place. Preferably the droplets are stable for around 30 minutes to around 60 minutes.

The hydrophilic and hydrophobic parts of the CNTs are arranged on their surface, meaning that the CNTs tend to lie parallel to the phase interface. This compares with conventional surfactant molecules having a hydrophilic head group and a hydrophobic tail that align themselves perpendicular to the phase interface.

In order to form the polymer-CNT composite, a co-deposition process is used in which the CNTs are coated with the polymer. The co-deposition process can be carried out chemically, through the use of a polymerisation instigator such as an oxidant, or electrochemically.

The electrochemical co-deposition process of some embodiments of the present invention produces a number of dynamic changes to the dispersion. The reason for this is that hydrophobic monomers, such as EDOT, cannot transport through the polar phase and the CNTs are not able to enter the non-polar phase.

It is thought that during the co-deposition process the droplets of the non-polar phase, containing the monomer, shrink as the polymer is consumed by electrochemical polymerisation and the accompanying non-polar solvent, e.g. acetonitrile, diffuses into the neighbouring polar phase, e.g. water. This process would generate crater-like pores observed on the surface of the deposited composite. Once the components of the composite in the droplets closest to the electrode have been deposited in this way, further droplets from the dispersion could diffuse in to take their place, giving rise to subsequent craters. The CNTs in the polymer-CNT composite maintain the conductivity of the electrode surface, which allows the electrochemical co-deposition to continue.

The initial growth of the polymer-CNT composite coating is thought to give rise to the smaller craters (around 1 μm to 10 μm in diameter) that are observed on the surface of the coating. This is because the droplets of polar or non-polar phase are initially relatively small. As the electrolysis continues, it is thought that, when the polar solvent is water and the non-polar solvent is acetonitrile, the aqueous droplets grow larger as the acetonitrile diffuses into the aqueous phase resulting in the larger craters (generally >10 μm, some >100 μm) that are observed as deposited on top of the earlier formed smaller craters.

The larger voltammetric current and higher electrode capacitance of the composites of the present invention is thought to be due to a number of effects, (i) the provision of interconnected pathways for electrons through the CNTs and ions in the pore network of the composite, regardless of the conductivity of the polymer, (ii) the thinness of the polymer layer on each CNT, minimising the barriers both to ion transfer across the polymer/electrolyte interface and ion transport within the polymer phase, and (iii) the role of smaller cations in charge balancing due to the presence of the immobilised negatively charged CNTs.

The present invention will be further described in greater detail by reference to the following Figures of the accompanying drawings which are not intended to limit the scope of the invention claimed, in which:

Comparative Example 5 ml of a 0.25 mol $L^{-1}$ solution of EDOT in acetonitrile was added to 5 ml of water. A colour indicator, such as $CuCl_2$, can be added to indicate which of the two layers is the aqueous layer. This mixture was sonicated for 10 minutes. Once sonication had ceased the organic and aqueous phases separated to give an upper organic phase having a golden colour due to the dissolved EDOT (3,4-ethylene-dioxythiophene). The volume of the upper organic phase was approximately 2 ml, indicating that more that half of the acetonitrile remained partitioned in the water.

Example 1

5 ml of a 0.25 mol $L^{-1}$ solution of EDOT in acetonitrile was added to 5 ml of a 0.3 wt % aqueous suspension of acid-treated multiwalled CNTs. This mixture was sonicated for 10 minutes. However, instead of the organic and aqueous phases separating, a metastable organoaqueous emulsion was formed.

The emulsion was deaerated with argon and used for potentiostatic polymerisation at 1.0V without the addition of any other electrolyte. The working electrode was a 1.6 mm Pt disc or 6 mm graphite disc used in conjunction with a Ag/AgCl (3 mol $L^{-1}$) reference and a Pt wire counter electrode. Once a suitable charge had been passed the electrolysis was terminated, resulting in a smooth and coherent black coating of PEDOT-CNT composite on the working electrode. In this example, a deposition charge of 0.3 C $cm^{-2}$ was used.

The stability of the PEDOT-CNT emulsion means that it can be used for several PEDOT-CNT composite depositions before phase separation occurs. The emulsion can also be regenerated after phase separation, provided that the consumption of EDOT and CNT is not too great, by ultrasonicating the solutions. The quality of the PEDOT-CNT composites formed is not affected by regeneration of the emulsion.

Figure 1:
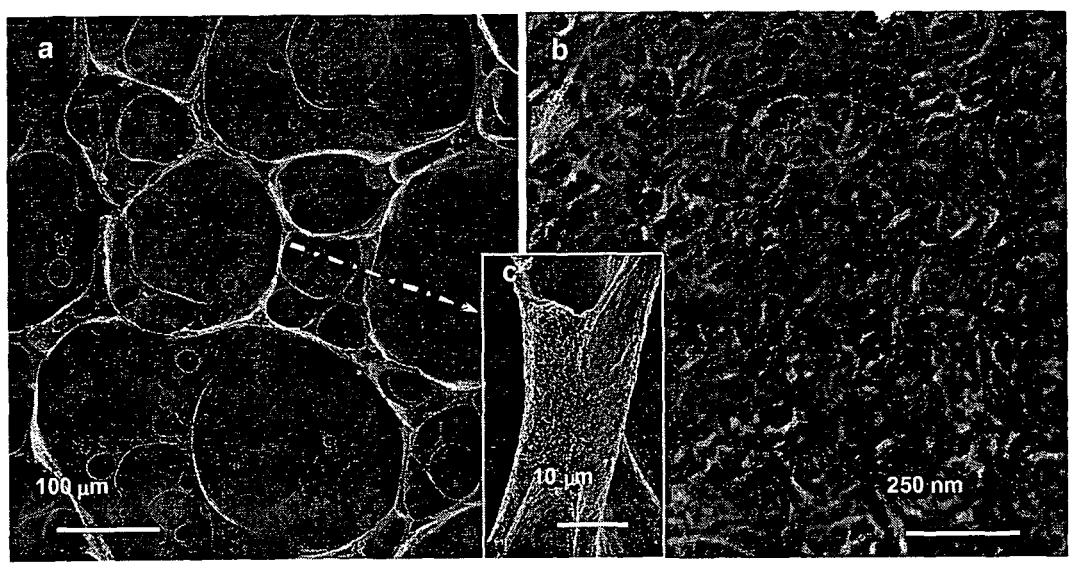
FIG. 1 shows Scanning Electron Microscope (SEM) images of an electrochemically deposited PEDOT-CNT composite deposited in accordance with an embodiment of the present invention.

The PEDOT-CNT composite formed was observed under a scanning electron microscope, generating the images shown in FIG. 1. FIG. 1(a) shows a series of shallow craters up to a few hundred micrometers in diameter on the surface of the composite. Smaller craters with or without a bank ring (the raised portion at the edge of the crater) are observed at the bases of the larger craters. This shows that during the earlier stages of the formation of the PEDOT-CNT composite coating the smaller craters are formed, and that as the electrolysis continues the larger craters are formed on top of the smaller ones.

FIG. 1(b) is a higher magnification image of a base of one of the craters. This figure shows a network of nanofibrils with a degree of local alignment.

The relatively flat bases of the craters formed on the surface of the PEDOT-CNT composite shown in FIG. 1(a) might have resulted from the flattening of the aqueous droplets of the emulsion as they wet the surface of the composite coating. During the deposition process, the droplets cause basket-shaped structures of PEDOT-CNT to be formed on the surface of the composite. The fact that the nanofibrils in FIG. 1(b) lie parallel to the electrode surface suggests simple collapse of these basket-like structures upon drying.

The black coating was confirmed to be PEDOT-CNT by the uneven surface of the nanofibrils. Also, the diameter of the nanofibrils was around 30 to 50 nm compared with around 10 to 30 nm for uncoated CNTs. In addition, Energy Dispersive X-ray analysis of the composition of the base of a crater gave a typical composition of 81 atomic % C, 15 atomic % O and 4 atomic % S. The detection of sulphur confirmed the presence of PEDOT. However, compared with the composition of pure PEDOT, 6C:2O:1S, excess carbon and oxygen was present. This excess is likely to be due to the oxidised CNTs.

As shown in FIG. 1(c), many of the bank rings were found to be hollow. The hydrophobicity of EDOT means during the later stages of the deposition of the PEDOT-CNT composite the polymerisation is likely to occur in the remaining organic phase between the large aqueous droplets, resulting in the observed hollow structure in the bank rings. The typical composition of the PEDOT-CNT composite at the bank rings was found to be 87 atomic % C, 12 atomic % O and 1 atomic % S, indicating a lower PEDOT concentration than at the bases of the craters.

After deposition, the PEDOT-CNT composite coated electrodes were rinsed with distilled water and transferred, together with the reference and counter electrodes, to an aqueous solution of 0.5 mol $L^{-1}$ KCl for cyclic voltammetry and electrochemical impedence spectroscopy studies.

Figure 2:
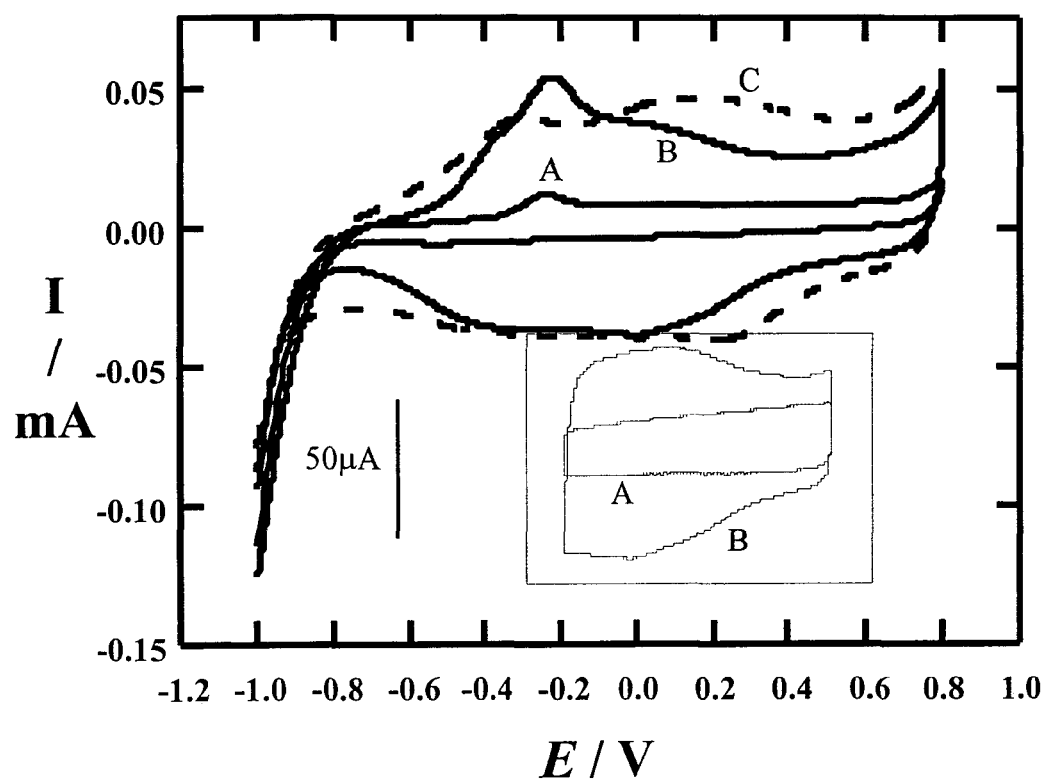
FIG. 2 shows cyclic voltammograms of a PEDOT polymer of the prior art and a PEDOT-CNT composite deposited in accordance with an embodiment of the present invention.

FIG. 2 shows several overlaid cyclic voltammograms and in inlay a view of two voltammograms over a smaller potential range. Voltammogram A is for a first cycle of pure PEDOT prepared as set out in the Comparative Example using LiClO$_4$ as a supporting electrolyte. Voltammogram B shows a first cycle of a PEDOT-CNT composite prepared as previously described. Voltammogram C shows a cycle of the same PEDOT-CNT composite after 5000 charge-discharge cycles. The cyclic voltammogram parameters were as follows:

| | |
|---|---|
| Deposition Potential | 1.0 V |
| Charge | 0.3 C cm$^{-2}$ |
| Potential Scan Rate | 20 mV s$^{-1}$ |
| Electrode Substrate | 1.6 mm diameter Pt disc |
| Electrolyte | 0.5 mol L$^{-1}$ KCl in water |
| Reference Electrode | Ag/AgCl (3M KCl) |

FIG. 2 clearly shows that the PEDOT-CNT composite responded to the potential cycling with much larger currents than the pure PEDOT. As shown in the inlay in FIG. 2, when the potential scan was limited to a much smaller but more positive range of around −0.2 V to around +0.5 V (i.e. where the polymers remained in the oxidised/doped state, typical capacitive behaviour) rectangular current-potential curves were observed. Since the currents on such rectangular curves are directly linked to capacitance (capacitance=current/potential scan rate), this shows that the PEDOT-CNT composite had a much greater capacitance.

As well as the variation in peak currents, FIG. 2 shows that the electrochemistry of the PEDOT-CNT composite changes after continuous charge-discharge cycling. It is thought that this change is due to the large and immobile negatively charged CNTs. These CNTs mean that both the cation (K$^+$) and the anion (Cl$^-$) from the electrolyte may participate in the redox process during potential cycling. This mixed ion character is in contrast with pure PEDOT in which only the anion participates in the redox process during potential cycling.

The deposited coatings were scraped off the electrode and analysed by infrared (IR) spectrometry. It was found that the PEDOT-CNT composite retained the IR features of doped pure PEDOT even at very negative potentials at which pure PEDOT would already be reduced (dedoped), resulting in a significantly different IR spectrum. The reason for this is thought to be that the CNTs enhance electron delocalisation along the polymer chains.

Figure 3:
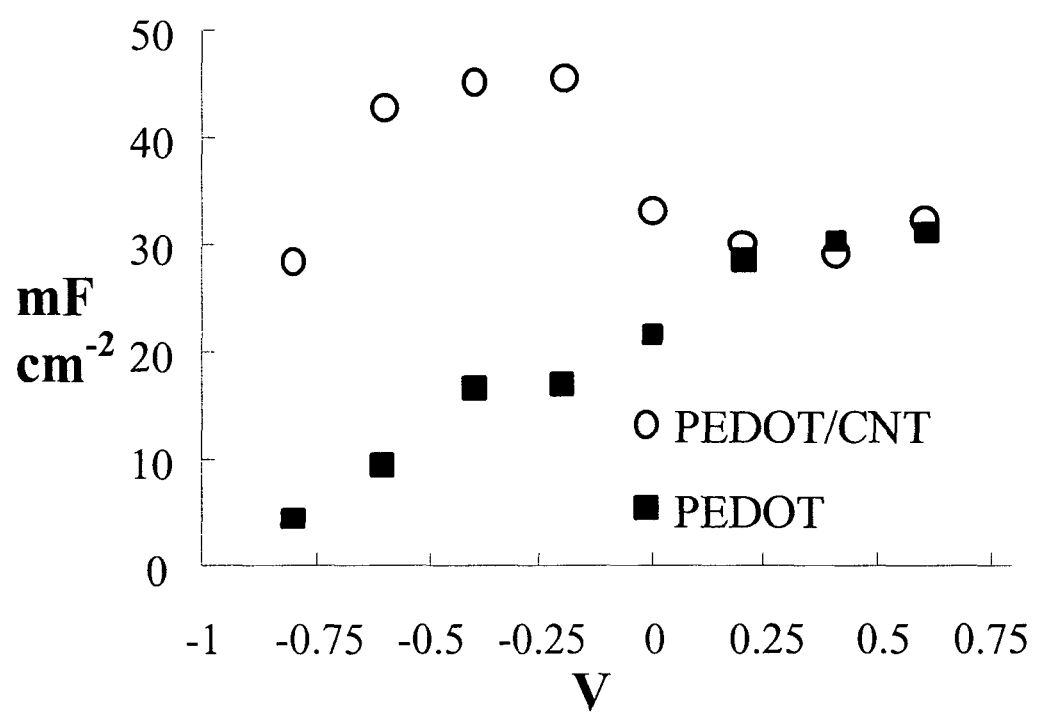
FIG. 3 shows a graph of capacitance (y-axis) versus potential (x-axis) for a PEDOT polymer of the prior art and a PEDOT-CNT composite deposited in accordance with an embodiment of the present invention.

The conclusion regarding the differing IR spectra of pure PEDOT and the PEDOT-CNT composite is supported by the capacitance measurement by electrochemical impedance spectrometry shown in FIG. 3. The measurements were carried out at 0.0 V against an Ag/AgCl (3 mol L$^{-1}$) reference electrode. This graph demonstrates the higher capacitance of the PEDOT-CNT composite when compared to pure PEDOT at negative potentials. In this case, all the coatings tested were formed using a deposition charge of 0.3 C cm$^{-2}$.

Figure 4:
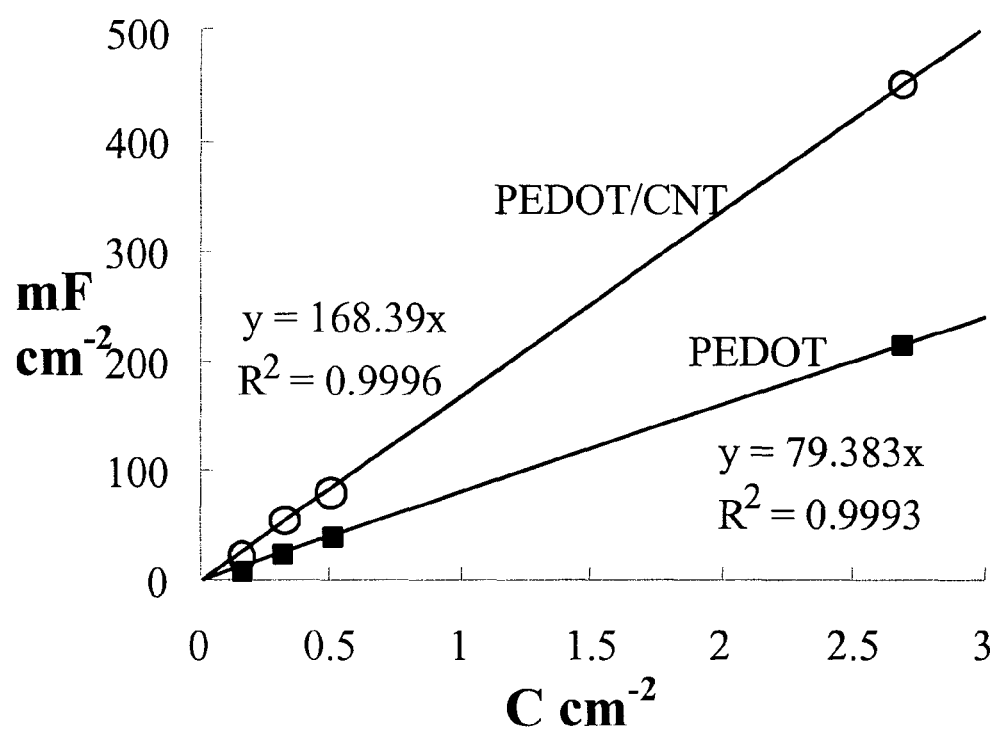
FIG. 4 shows a graph of capacitance (y-axis) versus deposition charge (x-axis) for PEDOT polymer of the prior art and a PEDOT-CNT composite deposited in accordance with an embodiment of the present invention.

The capacitance of a series of PEDOT-CNT composite coatings grown at various depositions charges, a higher deposition charge corresponding to a thicker coating, was measured by electrochemical impedance spectrometry in 0.5 mol L$^-$ KCl and the results are shown in FIG. 4. The measurements were carried out at 0.0 V against an Ag/AgCl (3 mol L$^{-1}$) reference electrode. This graph shows that the capacitance increases linearly for both the PEDOT-CNT composite and the pure PEDOT, and that the PEDOT-CNT composite provides a significantly larger capacitance.

The linear relationship shown in FIG. 4 fails at high deposition charges, although electropolymerisations can continue up to very high depositions charges of around 60 C cm$^{-2}$. After passing a very high deposition charge, instead of a coherent coating being formed on the electrode, a large gel-like drop is produced instead. After drying, the gel forms a coating. However, these coatings are generally not well defined and they spread beyond the electrode disc (1.6 mm diameter) and onto the insulating sheath (5 mm diameter). Capacitance measurements of such coatings resulted in significantly lower readings than would be expected from extrapolation of the graph shown in FIG. 4. This behaviour was also encountered during the codeposition of polypyrrole and CNTs and is thought to be due to the network forming properties of the high aspect ratio CNTs.

The invention claimed is:

1. A composite comprising carbon nanotubes coated with a polymer,
   wherein the carbon nanotubes are multi-walled and have been at least partially oxidised, with the carbon nanotubes therefore having a graphene layer giving hydrophobic functionality and having negatively charged hydroxyl and carboxylic groups formed on the graphene layer giving hydrophilic functionality,
   wherein the polymer comprises at least one hydrophobic monomer unit,
   wherein the carbon nanotubes have been coated with the polymer using a co-deposition process, said co-deposition process involving the use of said hydrophobic monomer dissolved in a non-polar solvent and said carbon nanotubes dispersed in a polar solvent, and wherein the composite has two types of pores that are identified by their different sizes and formation mechanisms, with one type of pores having a pore size of ≤1 μm and being formed due to gaps or interstices between the carbon nanotubes of the composite, and the other type of pores having a pore size of >1 μm and being formed when the carbon nanotubes are coated with the polymer by the co-deposition process, wherein crater-like pores formed in such a manner can be observed on the surface of the deposited composite.

2. A composite as claimed in claim 1, wherein the thickness of the polymer coating can vary along the length of each carbon nanotube but is at least 1 nm thick.

3. A composite as claimed in claim 2, wherein the thickness of the polymer coating can vary along the length of each carbon nanotube but is between 1 nm and 500 nm thick.

4. A composite as claimed in claim 3, wherein the thickness of the polymer coating can vary along the length of each carbon nanotube but is between 1 nm and 200 nm thick.

5. A composite as claimed in claim 4, wherein the thickness of the polymer coating can vary along the length of each carbon nanotube but is between 10 nm and 100 nm thick.

6. A composite as claimed in claim 1, wherein the composite comprises nanofibrils.

7. A composite as claimed in claim 1, wherein the polymer is a conducting polymer.

8. A composite as claimed in claim 7, wherein the conducting polymer is poly[3,4-ethylene-dioxythiophene].

9. A battery, supercapacitor, electrochemical reactor, photovoltaic cell, sensor, chromic display or solar cell comprising the composite of claim 1.

10. A process for the production of a composite comprising a polymer and carbon nanotubes, the process comprising the steps of:
(a) dissolving at least one hydrophobic monomer in a non-polar solvent to form a solution;
(b) dispersing carbon nanotubes in a polar solvent to form a suspension;
(c) forming an emulsion of the solution and the suspension;
(d) polymerising the hydrophobic monomer, and
(e) coating the carbon nanotubes with the polymer,
wherein the polymerising and coating steps are performed using a co-deposition process involving the use of the hydrophobic monomer dissolved in the non-polar solvent and the carbon nanotubes dispersed in the polar solvent,
wherein the carbon nanotubes are multi-walled and have been at least partially oxidised, before step (b), with the carbon nanotubes therefore having a graphene layer giving hydrophobic functionality and having negatively charged hydroxyl and carboxylic groups formed on the graphene layer giving hydrophilic functionality,
and wherein the composite has two types of pores that are identified by their different sizes and formation mechanisms, with one type of pores having a pore size of ≤1 μm and being formed due to gaps or interstices between the carbon nanotubes of the composite, and the other type of pores having a pore size of >1 μm and being formed when the carbon nanotubes are coated with the polymer by the co-deposition process, wherein crater-like pores formed in such a manner can be observed on the surface of the deposited composite.

11. A process as claimed in claim 10, wherein the polymerising and coating steps are performed electrochemically.

12. A process as claimed in claim 10, wherein the polymerising and coating steps are performed chemically.

13. A process as claimed in claim 10, wherein the at least partial oxidation is by acid treatment.

14. A process as claimed in claim 10, wherein the monomer is 3,4-ethylene-dioxythiophene.

15. A composite comprising a polymer and multi-walled carbon nanotubes, the composite being obtainable according to a process that comprises the steps of:
(a) dissolving at least one hydrophobic monomer in a non-polar solvent to form a solution;
(b) dispersing multi-walled carbon nanotubes in a polar solvent to form a suspension;
(c) forming an emulsion of the solution and the suspension;
(d) polymerising the hydrophobic monomer; and
(e) coating the carbon nanotubes with the polymer;
wherein the polymerising and coating steps are performed electrochemically, using a co-deposition process, the co-deposition process involving the use of the hydrophobic monomer dissolved in the non-polar solvent and the carbon nanotubes dispersed in the polar solvent,
wherein the multi-walled carbon nanotubes have been at least partially oxidised before step (b), with the carbon nanotubes therefore having a graphene layer giving hydrophobic functionality and having negatively charged hydroxyl and carboxylic groups formed on the graphene layer giving hydrophilic functionality,
and wherein the composite has two types of pores that are identified by their different sizes and formation mechanisms, with one type of pores having a pore size of ≤1 μm and being formed due to gaps or interstices between the carbon nanotubes of the composite, and the other type of pores having a pore size of >1 μm and being formed when the carbon nanotubes are coated with the polymer by the co-deposition process, wherein crater-like pores formed in such a manner can be observed on the surface of the deposited composite.

16. A composite as claimed in claim 1, wherein the multi-walled carbon nanotubes have been at least partially oxidised by acid treatment.

17. A composite as claimed in claim 15, wherein the multi-walled carbon nanotubes have been at least partially oxidised before step (b) by acid treatment.

* * * * *